(12) United States Patent
Aue

(10) Patent No.: US 10,013,343 B2
(45) Date of Patent: Jul. 3, 2018

(54) APPARATUS AND METHOD OF REFRESHING A MEMORY AREA OF A NON-VOLATILE MEMORY UNIT USED IN AN EMBEDDED SYSTEM

(71) Applicant: Robert Bosch GmbH, Stuttgart (DE)

(72) Inventor: Axel Aue, Korntal-Muenchingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/707,374

(22) Filed: May 8, 2015

(65) Prior Publication Data
US 2015/0325291 A1   Nov. 12, 2015

(30) Foreign Application Priority Data

May 8, 2014   (DE) .......................... 10 2014 208 609

(51) Int. Cl.
*G11C 13/00*   (2006.01)
*G11C 16/34*   (2006.01)
*G06F 12/02*   (2006.01)

(52) U.S. Cl.
CPC ...... *G06F 12/0238* (2013.01); *G11C 13/0033* (2013.01); *G11C 16/3418* (2013.01); *G06F 2212/1008* (2013.01)

(58) Field of Classification Search
CPC .................................................. G11C 13/0033
USPC ....................................................... 365/222
See application file for complete search history.

(56) References Cited

U.S. PATENT DOCUMENTS

| | | | | |
|---|---|---|---|---|
| 5,625,791 A | * | 4/1997 | Farrugia | G06Q 20/341 235/492 |
| 5,699,297 A | * | 12/1997 | Yamazaki | G11C 16/102 365/185.11 |
| 5,896,318 A | * | 4/1999 | Asada | G11C 16/26 365/185.11 |
| 5,950,224 A | * | 9/1999 | Devin | G11C 11/56 365/185.25 |
| 5,963,473 A | * | 10/1999 | Norman | G06F 11/1068 365/185.02 |
| 6,044,004 A | * | 3/2000 | Kramer | G11C 7/1045 365/185.03 |
| 6,160,738 A | * | 12/2000 | Atsumi | G11C 16/3418 365/185.11 |
| 6,240,032 B1 | * | 5/2001 | Fukumoto | G11C 11/5621 365/185.11 |
| 6,396,744 B1 | * | 5/2002 | Wong | G11C 11/56 365/185.22 |

(Continued)

*Primary Examiner* — Anthan Tran
*Assistant Examiner* — Mushfique Siddique
(74) *Attorney, Agent, or Firm* — Norton Rose Fulbright US LLP; Gerard Messina

(57) ABSTRACT

A method for performing a refresh of a first memory area of a non-volatile memory unit includes overwriting at least one additional memory area of the non-volatile memory unit with a memory content from the first memory area, adding a reference to the at least one additional memory area to a memory address area corresponding to the memory content and removing a reference to the first memory area from the memory address area corresponding to the memory content, overwriting the first memory area with the memory content from the at least one additional memory area, and subsequently replacing the reference in the memory address area with the reference to the first memory area.

12 Claims, 1 Drawing Sheet

(56) References Cited

U.S. PATENT DOCUMENTS

| | | | | |
|---|---|---|---|---|
| 6,429,984 B1* | 8/2002 | Alex | G11B 19/04 | 360/31 |
| 6,522,586 B2* | 2/2003 | Wong | G11C 11/56 | 365/185.08 |
| 6,856,568 B1* | 2/2005 | Wong | G11C 11/56 | 365/185.25 |
| 7,325,090 B2* | 1/2008 | Ronen | G11C 11/406 | 711/103 |
| 7,447,096 B2* | 11/2008 | Riekels | G11C 7/1051 | 365/185.12 |
| 7,451,266 B2* | 11/2008 | Shinagawa | G06F 12/0246 | 365/185.33 |
| 7,808,834 B1* | 10/2010 | Sutardja | G11C 16/3431 | 365/185.11 |
| 8,161,355 B2* | 4/2012 | Fung | G06F 11/1068 | 365/185.22 |
| 8,243,525 B1* | 8/2012 | Kan | G11C 16/3418 | 365/185.11 |
| 8,412,921 B2* | 4/2013 | Fislage | G06F 8/65 | 713/1 |
| 8,456,938 B2* | 6/2013 | Byom | G11C 16/3431 | 365/185.25 |
| 8,908,443 B1* | 12/2014 | Ellis | G11C 11/5628 | 365/185.22 |
| 8,972,652 B2* | 3/2015 | Kim | G11C 16/3418 | 711/103 |
| 8,982,653 B2* | 3/2015 | Nurminen | G11C 7/04 | 365/211 |
| 9,129,699 B2* | 9/2015 | Suzuki | G11C 16/3404 | |
| 2001/0032038 A1* | 10/2001 | Eiting | G05B 19/042 | 701/1 |
| 2004/0170060 A1* | 9/2004 | Ishimoto | G11C 11/406 | 365/185.25 |
| 2005/0281095 A1* | 12/2005 | Eilert | G11C 16/06 | 365/189.12 |
| 2008/0126717 A1* | 5/2008 | Otterstedt | G06Q 20/341 | 711/154 |
| 2009/0019213 A1* | 1/2009 | Boettcher | G11C 16/105 | 711/103 |
| 2010/0027314 A1* | 2/2010 | Chevallier | G11O 5/02 | 365/148 |
| 2010/0030823 A1* | 2/2010 | Meller | G06F 8/654 | 707/E17.044 |
| 2010/0030953 A1* | 2/2010 | Noh | G06F 12/0246 | 711/104 |
| 2010/0067295 A1* | 3/2010 | Yen | G11C 16/10 | 365/185.02 |
| 2010/0165692 A1* | 7/2010 | Jeddeloh | G11C 11/406 | 365/51 |
| 2010/0332949 A1* | 12/2010 | d'Abreu | G06F 11/1004 | 714/766 |
| 2011/0058424 A1* | 3/2011 | Goda | G11C 11/5628 | 365/185.19 |
| 2011/0066899 A1* | 3/2011 | Kang | G06F 11/1068 | 714/54 |
| 2011/0119431 A1* | 5/2011 | Chowdhury | G11C 16/3418 | 711/103 |
| 2011/0145521 A1* | 6/2011 | Aoki | G11C 7/04 | 711/154 |
| 2011/0208956 A1* | 8/2011 | Fislage | G06F 8/65 | 713/2 |
| 2012/0221773 A1* | 8/2012 | Shuto | G06F 11/1068 | 711/103 |
| 2013/0003451 A1* | 1/2013 | Bedeschi | G11C 16/3418 | 365/163 |
| 2013/0007344 A1* | 1/2013 | Belgal | G06F 12/0246 | 711/103 |
| 2013/0238836 A1* | 9/2013 | Suzuki | G11C 16/3431 | 711/103 |
| 2014/0143473 A1* | 5/2014 | Kim | G11C 16/3418 | 711/103 |
| 2014/0173180 A1* | 6/2014 | D'Abreu | G06F 12/0246 | 711/103 |
| 2014/0254298 A1* | 9/2014 | Dally | G11C 11/406 | 365/222 |
| 2015/0081958 A1* | 3/2015 | Li | G06F 1/30 | 711/103 |
| 2015/0134888 A1* | 5/2015 | Kimberly | G11C 16/105 | 711/103 |
| 2015/0170753 A1* | 6/2015 | Nitta | G11C 16/3418 | 365/185.11 |
| 2015/0179274 A1* | 6/2015 | Kim | G11C 16/3418 | 711/103 |
| 2015/0186071 A1* | 7/2015 | Stewart | G06F 3/0625 | 711/156 |
| 2015/0325291 A1* | 11/2015 | Aue | G11C 16/3418 | 365/222 |
| 2015/0331620 A1* | 11/2015 | Hohnke | G06F 21/78 | 711/103 |
| 2015/0364190 A1* | 12/2015 | Aue | G11C 13/0033 | 365/148 |
| 2016/0365138 A1* | 12/2016 | Cho | G11C 11/40626 | |

* cited by examiner

APPARATUS AND METHOD OF REFRESHING A MEMORY AREA OF A NON-VOLATILE MEMORY UNIT USED IN AN EMBEDDED SYSTEM

FIELD OF THE INVENTION

The present invention relates to a method for carrying out a refresh of a memory area of a non-volatile memory unit.

BACKGROUND

Non-volatile random access memory units (NVRAM) are used to store data permanently. Although non-volatile memory units maintain the memory content even without a supply of current, the memory content nevertheless dissipates sooner or later as a function of the type of the memory unit (flash memory, magnetoresistive random access memory (MRAM), phase change memory (PCM), resistive random access memory (RRAM), or ferroelectric random access memory (FRAM)). Even non-volatile memory units must therefore be refreshed every once in a while.

In non-volatile memory units, so-called refreshes of the memory content stored therein are performed at certain time intervals in order to maintain the memory content. For this purpose, the memory content of the memory area is read in and the corresponding memory area is again overwritten with this read-in memory content.

A use of such non-volatile memory units in embedded systems, for example in a motor vehicle, proves to be problematic especially due to these refreshes.

Accessing a memory area while a refresh of the memory area is being performed is usually not possible in a regular manner. During a refresh, neither reading nor writing of the respective memory area is thus possible in the course of a regular operation of the non-volatile memory unit. Therefore, in an embedded system, an application that accesses a respective memory area during regular operation must be stopped in order to perform a refresh of the memory area.

In an embedded system, this situation may result in high runtime losses. If it is not possible to access certain memory contents during a refresh, in an embedded system of a motor vehicle for example, this may result in a great reduction of an output produced by the engine of the motor vehicle or in the engine not being able to continue to rotate.

SUMMARY

Example embodiments of the present invention provide a possibility of performing a refresh of a memory area of a non-volatile memory unit in a processing unit without incurring increased runtime losses of the processing unit.

According to an example embodiment of the present invention, a method is provided for performing a refresh of a first memory area of a non-volatile memory unit. The non-volatile memory unit includes at least two memory areas, which can have different memory contents written into them. A refresh is to be performed of a first of these memory areas, that is, a memory refresh of the memory content stored in this first memory area.

In order to be able to access the individual memory areas, a memory address area is provided in the memory unit. Different memory addresses are stored in this memory address area. These different memory addresses address or refer to memory areas of the memory unit. With the aid of these memory addresses, it is thus possible to access memory areas of the memory unit. The memory address area can be developed for example as a register or a look-up table.

In particular, specific memory contents are accessed using the memory address area. The memory addresses of the memory address area each refers respectively to the memory area in which a specific memory content is stored. In the memory address area, the memory area associated with a specific memory content is thus indicated, in which the specific memory content is stored.

In the course of the refresh of the first memory area, initially at least one additional memory area of the non-volatile memory unit is overwritten with the memory content from a first memory area. For example, in an example embodiment, the at least one additional memory area is first erased and subsequently the memory content from the first memory area is copied into the at least one additional memory area.

The at least one additional memory area is indicated in the memory address area for the respective memory content. Furthermore, the first memory area is hidden in the memory address area for the respective memory content. If the memory content is to be accessed, the memory address area thus no longer points to the first memory area, but to the at least one additional memory area.

In the course of the refresh, the first memory area is overwritten with the memory content from the at least one additional memory area. In particular, first the memory content is deleted from the first memory area and subsequently the memory content is copied from the at least one additional memory area into the first memory area.

The memory content of the first memory area is thus refreshed. The first memory area is now indicated again in the memory address area for the memory content, and the at least one additional memory area is hidden. The memory address area is set to refer again to the first memory area for accessing the memory content.

In the process, the memory content can be copied precisely into one additional memory area or can also be copied into a suitable number of additional memory areas. The memory content can be copied completely into the additional memory areas or respectively different parts of the memory content can be copied into the different additional memory areas.

The present invention makes it possible to perform the refresh of the memory content in the first memory area and at the same time allows for a regular operation or a regular access to the memory content. The memory content can be accessed in the at least one additional memory area in the course of a regular operation during the refresh of the first memory area.

An application that currently accesses the memory content does not have to be stopped in order to perform the refresh. Moreover, an application that wants to access the memory content during the refresh also does not have to be stopped or be prevented from obtaining access. The respective application instead accesses the memory content in the at least one additional memory area during the refresh.

A processing unit, for which the non-volatile memory unit is provided, can thus be operated in a regular manner even during the refresh. The processing unit incurs no runtime losses during the refresh.

In an example embodiment, the at least one additional memory area of the non-volatile memory unit includes a second memory area and a third memory area. In the course of the refresh of the first memory area, the second and third memory areas are initially overwritten with the memory content from the first memory area. The second memory area is subsequently indicated in the memory address area for the memory content, and the first memory area is hidden. If the memory content is to be accessed during the refresh, the memory address area thus refers to the second memory area. In the course of a refresh, the first memory area is overwritten with the memory content from the third memory area. In particular, in an example embodiment, the first memory area is first erased and subsequently the memory content from the third memory area is copied into the first memory area. The memory content is read in from the third memory area in order to refresh the first memory area. If the memory content is to be accessed during the refresh in the course of the regular operation of the non-volatile memory unit, the memory content in the second memory area is accessed. It is thus possible to make a separation between access to the memory content for the refresh and access to the memory content for regular operation. This avoids simultaneous access to the memory content in the same additional memory area in the course of the refresh and in the course of regular operation. Such simultaneous access could result in a runtime loss. By storing the memory content in the second and third memory area, however, such a runtime loss can be prevented. After the refresh is performed, the first memory area is again indicated in the memory address area for the memory content, and the second memory area is hidden.

Advantageously, the at least one additional memory area is a memory area of the non-volatile memory unit, which, in non-refresh times, is not used in the regular operation of the non-volatile memory unit. In particular, the at least one additional memory area is provided as a backup in the event that a memory area fails.

The at least one additional memory area can also be provided explicitly for the refresh. In particular, with the aid of the at least one additional memory area, a refresh of all memory areas that are used in regular operation of the non-volatile memory unit is performed continuously, regularly or in response to a specific request. In particular, these memory areas that are used in regular operation are refreshed successively. All memory contents of the non-volatile memory unit are thus always refreshed. This prevents memory contents of the non-volatile memory units from no longer being able to be read out correctly or from being lost.

Such a request, in response to which the refresh is carried out, can be triggered by various criteria, for example by a read-out margin (when a check can be performed to determine whether electrical charges are lost from a memory area), an error correcting code (ECC), or a checksum. A refresh in response to such requests is advantageous for the service life since in each reprogramming the cells are respectively stressed in different technologies, which affects the service life negatively.

In an example embodiment, the non-volatile memory is used in an embedded system, for example in a control unit. The embedded system is used, for example, in a motor vehicle. As explained at the outset, the refresh of memory areas in an embedded system traditionally proves to be difficult because, during the refresh, the respective memory area cannot be accessed in the course of regular operation, which can result in high runtime losses of the embedded system.

Since the present invention makes it possible to refresh the memory content of the first memory area and at the same time to access the memory content in the at least one additional memory area, such runtime losses can be avoided. Applications of the embedded system, which access the memory content during the refresh of the first memory area, do not have to be stopped.

The present invention is especially suitable for embedded systems in a motor vehicle, for example for a control unit of a motor vehicle. The present invention thus makes a refresh of memory areas in the embedded system of the motor vehicle possible without performance fluctuations or runtime losses of the motor vehicle or disruptions in the rotation of the engine of the motor vehicle.

Control units in a motor vehicle are normally only in operation when the motor vehicle is also in operation and when therefore the control units are required for controlling the motor vehicle. It is therefore of particular importance that the control units run stably and without runtime losses and that the execution of a refresh does not result in performance fluctuations of the motor vehicle. Runtime losses or performance fluctuations of the motor vehicle may result in endangering occupants of the motor vehicle or even other road users. The present invention is able to increase safety when operating a motor vehicle.

The present invention is particularly suitable for embedded systems that carry out processes for controlling the engine of the vehicle. Runtime losses of such embedded systems may result in particular in performance fluctuations of the engine of the motor vehicle, which is prevented by the present invention. Such embedded systems, for example, determine injection times or a fuel quantity to be injected or a composition for the air-fuel mixture for the engine of the motor vehicle. The present invention is particularly advantageous for embedded system, which detect a rotational speed of the engine, control a fuel injection and/or ignition of the air-fuel mixture or regulate the pressure of a fuel rail. Furthermore, the present invention is particularly advantageous for communication between multiple control units, for example in order to exchange desired or requested torques between the control units.

In an example embodiment, a processing unit according to the present invention, such as a control unit of a motor vehicle for example, is equipped, particularly in terms of program technology, to carry out a method according to the present invention.

The implementation of the method in the form of software is also advantageous, since this incurs particularly low costs, especially if an executing control unit is also used for other tasks and is therefore present anyway. Suitable data carriers for providing the computer program are, in particular, diskettes, hard disks, flash memories, EEPROMs, CD-ROMs, DVDs, etc. A download of a program via computer networks (Internet, intranet, etc.) is also possible.

Further advantages and developments of the present invention derive from the description and the enclosed drawings.

The features mentioned above and the features yet to be explained below can be used, not only in the combination indicated in each case, but also in other combinations or in isolation, without departing from the scope of the present invention.

The present invention is represented schematically in the drawings on the basis of exemplary embodiments and described in detail below with reference to the drawings.

DETAILED DESCRIPTION

Figure 1:
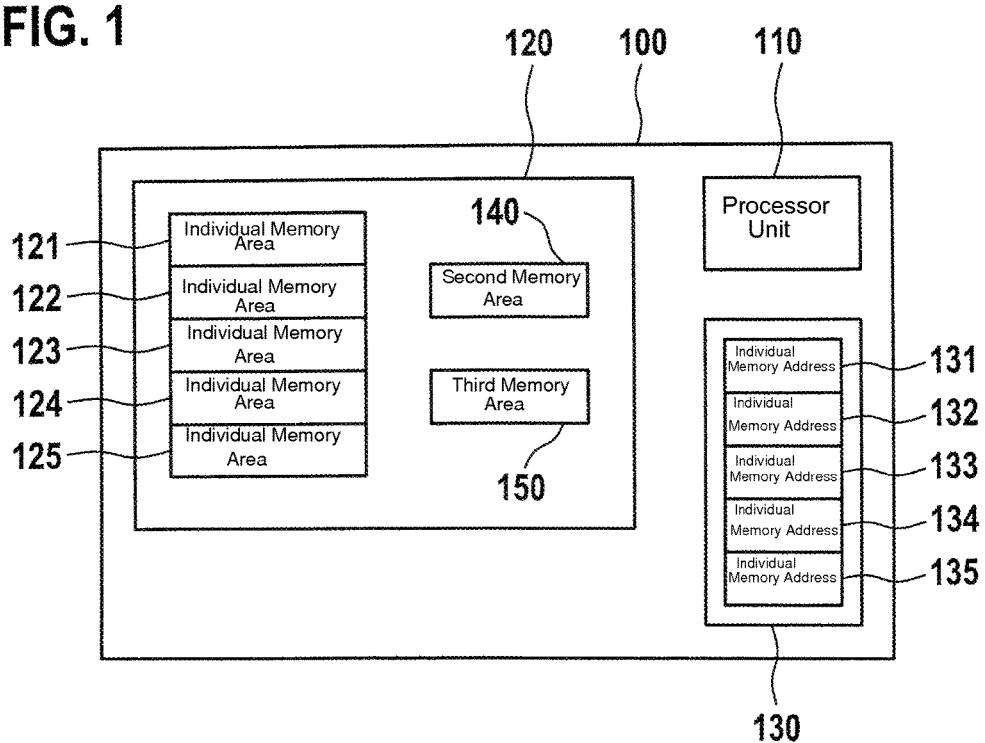
FIG. 1 shows schematically a control unit of a motor vehicle that is designed to carry out a method, according to an example embodiment of the present invention.

FIG. 1 schematically shows a control unit of a motor vehicle that is designated by reference numeral 100. Control unit 100 is developed as an embedded system in the motor vehicle. In this specific example, control unit 100 is an engine control unit for controlling an internal combustion engine of the motor vehicle.

Control unit 100 includes a processor unit 110 that is designed to execute specific processes. Control unit 100 also includes a non-volatile memory unit 120. Non-volatile memory unit 120 is developed for example as a magnetoresistive random access memory (MRAM), a phase change memory (PCM), a resistive random access memory (RRAM), a ferroelectric random access memory (FRAM) or a flash memory.

Non-volatile memory unit 120 includes a plurality of memory areas 121 through 125 that are independent of one another. These individual memory areas 121 through 125 are used in the course of a regular operation of control unit 100, for example for firmware data of control unit 100.

In the course of this regular operation, processor unit 110 executes processes for controlling the engine of the vehicle, for example in order to determine injection times or a fuel quantity to be injected. In order to execute these processes, processor unit 110 requires different input values.

These input values are stored as memory contents in the individual memory areas 121 through 125 of non-volatile memory unit 120.

Control unit 100 furthermore includes a memory address area 130. This memory address area 130 includes a plurality of memory addresses 131 through 135. The individual memory addresses 131 through 135 respectively point to the particular memory area of memory areas 121 through 125 in which a specific memory content is stored. The corresponding memory areas 121 through 125 for the individual memory contents are thus indicated in memory address area 130.

If processor unit 110 wants to access one of the specific memory contents, memory address area 130 thus points to the corresponding indicated memory area 121 through 125.

Control unit 100 is designed to carry out an example embodiment of a method according to the present invention. In the process, it is possible to perform memory refreshes of the individual memory areas 121 through 125.

For this purpose, non-volatile memory unit 120 includes two additional memory areas 140 and 150. These additional memory areas 140 and 150 are not used in non-refresh periods of the regular operation of control unit 100.

Figure 2:
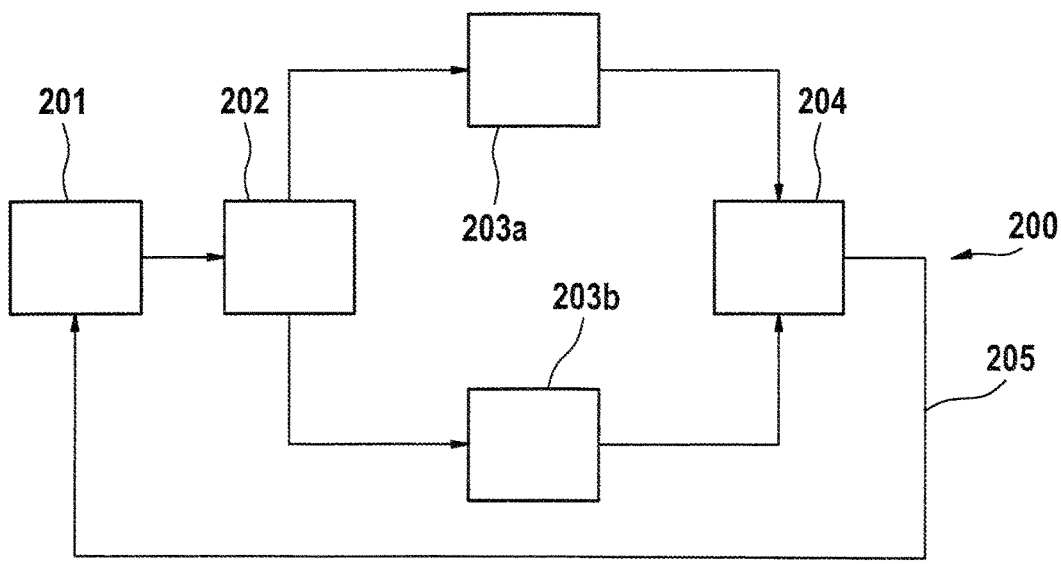
FIG. 2 schematically shows a method as a block diagram, according to an example embodiment of the present invention.

FIG. 2 illustrates, as a block diagram 200, a method according to an example embodiment the present invention. The following explains in exemplary fashion with reference to FIGS. 1 and 2 how the control unit performs a refresh of first memory area 121 with the aid of second memory area 140 and third memory area 150.

In a first step 201, the memory content of first memory area 121 is copied into both second memory area 140 and third memory area 150.

In a step 202, the second memory area 140 is indicated in memory address area 130 for this memory content. In so doing, memory address 131 for example, which previously pointed to first memory area 121, is directed to second memory area 140.

If processor unit 110 in step 203a must access the respective memory content in the course of the regular operation of control unit 100, in order to determine the injection time for the engine for example, memory address area 130 points to second memory area 140. In step 203a, processor unit 110 reads in the memory content from second memory area 140 in the course of the regular operation of control unit 100.

At the same time as the regular operation of control unit 100 in step 203a, the refresh of first memory area 121 is performed in step 203b. For this purpose, first the memory content of first memory area 121 is deleted and subsequently the memory content from third memory area 150 is read in and copied into first memory area 121. The memory content in first memory area 121 is thus refreshed.

Subsequently, in step 204, first memory area 121 is again indicated for the memory content in memory address area 130. Memory address 131, which previously pointed to second memory area 140, is directed again to first memory area 121.

Subsequently, in step 205, a refresh of the next memory area 122 of non-volatile memory unit 120 is performed.

Such a refresh of the individual memory areas 121 through 125 of non-volatile memory unit 120 of control unit 100 can be performed for example in fixed time intervals or every time control unit 100 is switched on and/or off or when control unit 100 and/or non-volatile memory unit 120 are switched to a sleep mode. Alternatively or additionally, the refresh of one of memory areas 121 through 125 can be performed when a specific criterion is fulfilled. Such a criterion can be for example the detection of an error or a certain number of errors in the corresponding memory area 121 through 125.

What is claimed is:

1. A method for performing a refresh of a first memory area of a non-volatile memory unit, comprising:
providing, in the non-volatile memory unit, a memory address area, the memory address area of the non-volatile memory unit storing a respective reference to each of a plurality of individual memory areas of the non-volatile memory, the first memory area being one of the plurality of the individual memory areas;
overwriting each of a second memory area of the non-volatile memory unit and a third memory area of the non-volatile memory unit with a memory content from the first memory area, so that the first memory area, the second memory area and the third memory area all store the same content, wherein the first memory area, the second memory area, and the third memory area are different memory areas of the non-volatile memory unit;
after the overwriting of the second memory area and the third memory area, in a first updating step, updating the memory address area to remove the respective reference to the first memory area and add, in place of the removed reference, a reference to the second memory area;
after the first updating step, overwriting the first memory area with the memory content from the third memory area; and
after the overwriting of the first memory area, in a second updating step, updating the memory address area to replace the reference to the second memory area with the respective reference to the first memory area.

2. The method of claim 1, wherein the non-volatile memory unit is used in an embedded system.

3. The method of claim 2, wherein the embedded system is in a motor vehicle.

4. The method of claim 1, wherein the non-volatile memory unit is one of: a magnetoresistive random access memory (MRAM), a phase change memory (PCM), a resistive random access memory (RRAM), a ferroelectric random access memory (FRAM), or a flash memory.

5. The method of claim 1, further comprising:
after the first updating step, accessing, by a processing unit the second memory area using reference to the second memory area.

6. The method of claim 1, wherein the memory address area is a look-up table stored on the non-volatile memory.

7. A control unit of a motor vehicle, comprising:
circuitry including an interface for coupling to a non-volatile memory unit and configured to refresh a first memory area of the non-volatile memory unit, a memory address area being provided in the non-volatile memory, the memory address area of the non-volatile memory storing a respective reference to each of a plurality of individual memory areas of the non-volatile memory, the first memory area being on of the plurality of individual memory areas, wherein the refresh includes:
overwriting each of a second memory area of the non-volatile memory unit and a third memory area of the non-volatile memory unit with a memory content from the first memory area so that the first memory area, the second memory area, and the third memory area all store the same content, wherein the first memory area, the second memory area, and the third memory area are different memory areas of the non-volatile memory unit;
after the overwriting of the second memory area and the third memory area, in a first updating step, updating the memory address area to remove the respective reference to the first memory area and add, in place of the removed reference, a reference to the second memory area;
after the first updating step, overwriting the first memory area with the memory content from the third memory area; and
after the overwriting of the first memory area, in a second updating step, updating the memory address area to replace the reference to the second memory area with the respective reference to the first memory area.

8. The control unit of claim 7, wherein the circuitry is configured to execute the refresh of the first memory unit one of: at fixed time intervals, every time the processing unit is switched on or off, when the circuitry or the memory unit is switched into a sleep mode.

9. The control unit of claim 7, wherein the circuitry is configured to execute the refresh of the first memory unit one of: continuously or in response to a specific request.

10. The control unit of claim 7, wherein the memory address area is a look-up table stored on the non-volatile memory.

11. A non-transitory computer readable medium on which are stored instructions that are executable by a processor and that, when executed by the processor, cause the processor to perform a method to refresh of a first memory area of a non-volatile memory unit, a memory address area being provided in the non-volatile memory unit, the memory address area of the non-volatile memory unit storing a respective reference to each of a plurality of individual memory areas of the non-volatile memory, the first memory area being one of the plurality of individual memory areas, the method comprising:
overwriting each of a second memory area of the non-volatile memory unit and a third memory area of the non-volatile memory unit with a memory content from the first memory area so that the first memory area, the second memory area, and the third memory area all store the same content, wherein the first memory area, the second memory area, and the third memory area are different memory areas of the non-volatile memory unit;
after the overwriting of the second memory area and the third memory area, in a first updating step, updating the memory address area to remove the respective reference to the first memory area and add, in place of the removed reference, a reference to the second memory area;
after the first updating step, overwriting the first memory area with the memory content from the third memory area; and
after the overwriting of the first memory area, in a second updating step, updating the memory address area to replace the reference to the second memory area with the respective reference to the first memory area.

12. The non-transitory computer readable medium of claim 11, wherein the memory address area is a look-up table stored on the non-volatile memory.

* * * * *